United States Patent [19]
Kranz

[11] 4,074,241
[45] Feb. 14, 1978

[54] RADIOSONDE CIRCUITRY FOR IMPEDANCE MEASUREMENT OF AN $Al_2O_3$ ABSOLUTE WATER VAPOR SENSOR

[75] Inventor: Paul Kranz, Harvard, Mass.

[73] Assignee: The United States of America as represented by the Secretary of the Navy, Washington, D.C.

[21] Appl. No.: 536,077

[22] Filed: Dec. 24, 1974

[51] Int. Cl.$^2$ .................. G08C 19/16; G08C 17/00
[52] U.S. Cl. .......................... 340/189 M; 324/65 R; 325/113; 325/115; 330/294; 340/177 VC; 340/203; 340/207 R
[58] Field of Search ....... 340/189 M, 207 R, 177 VA, 340/177 VC, 177 R, 235, 203; 325/113, 115; 73/170 R; 331/65, 108 A, 149, 145; 324/65 R; 328/4; 330/294

[56] References Cited

U.S. PATENT DOCUMENTS

| | | | |
|---|---|---|---|
| 3,059,177 | 10/1962 | Winchel | 331/65 |
| 3,204,195 | 8/1965 | Maestre | 331/145 |
| 3,253,588 | 5/1966 | Vuilleumier et al. | 340/189 M |
| 3,267,386 | 8/1966 | Davis et al. | 330/293 |
| 3,375,716 | 4/1968 | Hersch | 331/65 |
| 3,392,348 | 7/1968 | Horwitz | 325/113 |
| 3,573,776 | 4/1971 | Dick | 340/177 VA |
| 3,579,094 | 5/1971 | Jorgensen | 331/149 |
| 3,609,728 | 9/1971 | Quinn | 340/206 |
| 3,689,907 | 9/1972 | Guajardo | 340/235 |

Primary Examiner—John W. Caldwell, Sr.
Assistant Examiner—James J. Groody
Attorney, Agent, or Firm—R. Sciascia; R. Beers; S. Sheinbein

[57] ABSTRACT

An improved circuit permits measurement of the impedance of an $Al_2O_3$ water vapor sensor used with conventional radiosonde telemetry systems.

The circuit includes an oscillator, an output pulse shaper and a voltage regulator. The oscillator section is a temperature stabilized feedback oscillator which uses the sensor as a feedback element. The oscillator output is a square wave varying from 20 to 200 Hz over a dew point range, of 110° to 0° C. and is stable within ± 1% over a −60° to +20° C temperature range. The output pulse shaper converts the square wave from the oscillator to a 60 microsecond wide, 3 volt negative-going pulse suitable for modulating the radiosonde transmitter. The voltage regulator provides regulated +4.5 volts from the sonde battery for operating the oscillator and pulse shaper.

1 Claim, 1 Drawing Figure

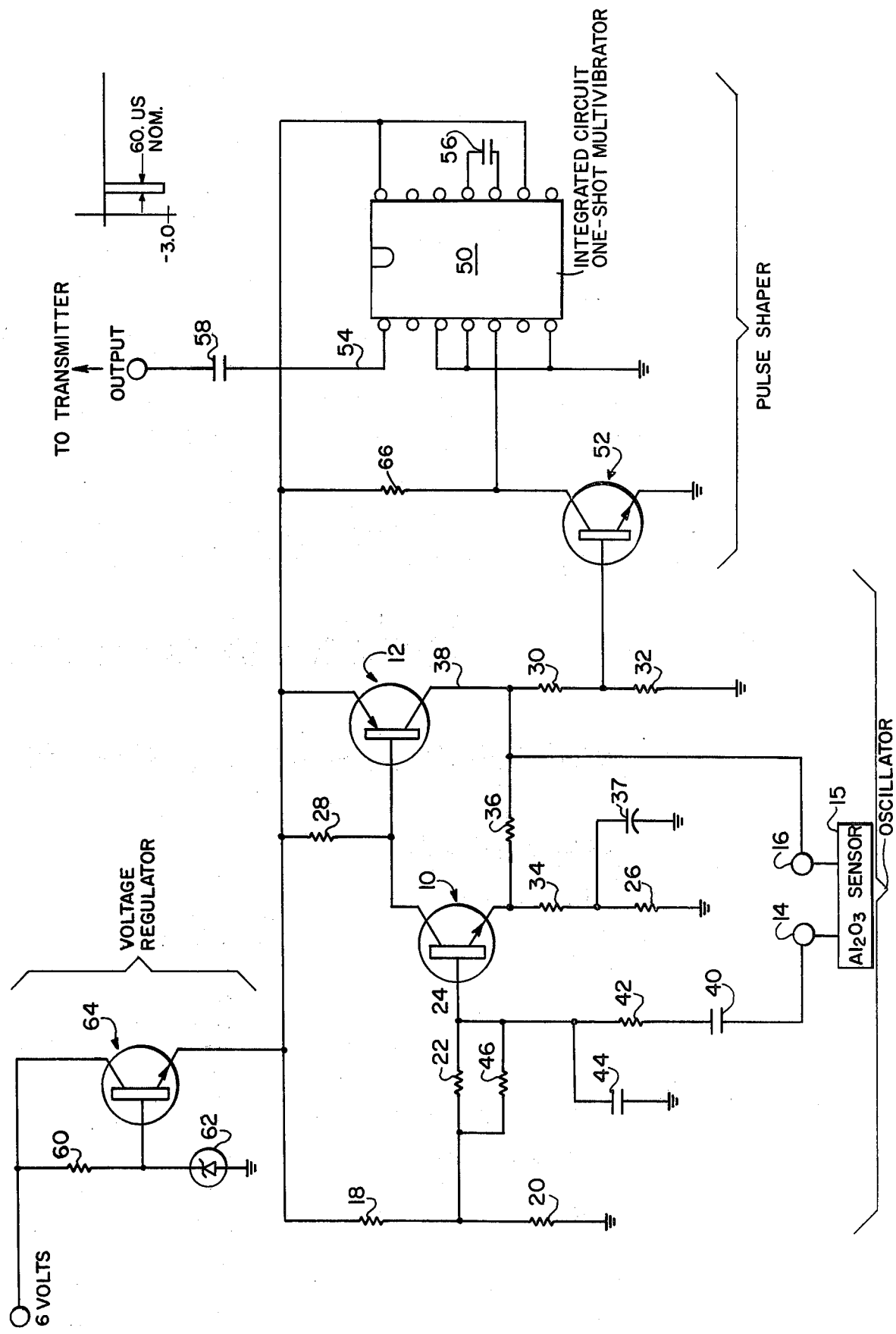

RADIOSONDE CIRCUITRY FOR IMPEDANCE MEASUREMENT OF AN AL₂O₃ ABSOLUTE WATER VAPOR SENSOR

BACKGROUND OF THE INVENTION

The invention relates to a circuit for measuring the impedance of an $Al_2O_3$ water vapor sensor which is compatible with conventional radiosondes. The circuit, together with the sensor, permits measurement of water vapor concentrations in the atmosphere and, more particularly, is the stratosphere.

Current radiosondes use the "carbon-element hygristor" which is inoperable at ambient temperatures below about $-35°$ to $-40°$ C. The $Al_2O_3$ sensor is not temperature limited in this way. Presently known and commercially used measuring circuitry is both compatible with known radiosonde telemetry systems and too expensive for semi-routine use in a radiosonde whose recovery is in doubt.

SUMMARY OF THE INVENTION

The present circuit is compatible with radiosonde telemetry systems and includes an oscillator, output pulse shaper and a voltage regulator. The oscillator section is a temperature stabilized feedback oscillator which uses an $Al_2O_3$ water vapor sensor as a feedback element. The oscillator output is a square wave varying from 20 to 200 Hz over a $-110°$ to $0°$ C. dew point range, and is stable within $\pm 1\%$ over a $-60°$ to $+20°$ C temperature range. The output pulse shaper converts the square wave from the oscillator to a 60 microsecond wide, 3 volt negative-going pulse suitable for modulating the radiosonde transmitter. The voltage regulator provides regulated $+4.5$ volts from the sonde battery for operating the oscillator and pulse shaper.

OBJECTS OF THE INVENTION

It is an object of the invention to measure the impedance of an $Al_2O_3$ water vapor sensor by an improved circuit having low power requirements which are compatible with radiosonde telemetry systems.

Another object of the invention is to provide an improved inexpensively constructed circuit which can be used in high altitude radiosonde where there is possibility of loss of the equipment.

Other objects, advantages and novel features of the present invention will become apparent from the following detailed description of the invention when considered in conjunction with the accompanying drawing.

BRIEF DESCRIPTION OF THE DRAWING

The single FIGURE is a Schematic diagram of a circuit for measuring the impedance of an $Al_2O_3$ water vapor sensor constructed in accordance with the present invention.

DETAILED DESCRIPTION OF THE INVENTION

The circuit to be described, when combined with an appropriate $Al_2O_3$ water vapor sensor, is useful in radiosondes for dew point measurement from $-110°$ to $0°$ C. As mentioned the circuit consists of an oscillator, an output pulse shaper and a voltage regulator. The oscillator section consists of transistors 10 and 12 which forms a temperature stabilized feedback oscillator using an $Al_2O_3$ sensor 15 of a type known in the art as the feedback element. The sensor 15 is shown generally in the circuit diagram since it forms no part of the present invention and any $Al_2O_3$ water vapor sensor can be connected between points 14 and 16 in the circuit diagram. Resistors 18 and 20 determine the dc bias point of transistor 10 while resistor 22 isolates the base 24 of transistor 10 from the low resistance of the bias provided by resistors 18 and 20. Transistors 10 and 12 are connected as a non-inverting amplifier with resistors 26, 28, 30, 34 and 32 controlling the bias of the amplifier as well as its open-loop dc gain. Resistors 26, 34 and 36 determine the closed-loop dc gain while capacitor 37 is an ac bypass across resistor 26. Positive feedback, which causes the oscillation of the amplifier, is provided from the collector output 38 of transistor 12 to the non-inverting base input 24 of the transistor 10 (and the amplifier) through an $Al_2O_3$ sensor 15 in series with capacitor 40 and resistor 42. As the sensor's impedance (the impedance between points 14 and 16) is affected by the presence of moisture, the time constant (determined by the sensor, resistor 42 and capacitor 40) of the ac positive feedback is changed, resulting in a shift in the oscillator's operating frequency. Capacitor 40, resistor 42, and capacitor 44 set the end points of the oscillator's frequency excursion to 20Hz and 200Hz for dew points of $0°$ and $-110°$ C respectively. The frequency of oscillation is trimmed to a specified value by shunting resistor 22 (the base oscillation resistance of transistor 10) with resistor 46. Temperature compensation to within $\pm 1\%$ of a fixed oscillation frequency over a $-60°$ to $+20°$ C temperature range is accomplished by proper selection of resistor 20. This adjusts the dc bias in such a way that several of the temperature-dependent characteristics of the amplifier tend to cancel each other, thus yielding a stable frequency of oscillation with temperature.

The square wave output from the oscillator is converted to a TTL (transistor-transistor logic)-compatible input signal for IC (integrated circuit) 50 by buffering the oscillator's output with transistor 52. IC 50 is a TTL integrated circuit one-shot multivibrator, which provides an output pulse on line 54, for example 60 μs wide and $-3.0$ volts, for each cycle of the oscillator. Capacitor 56, in conjunction with a timing resistor contained within integrated circuit 50, sets the pulse width of the circuit output in the range of 54 to 60 microseconds. Capacitor 58 couples the one-shot's output 54 to the radiosonde transmitter as a 3 volt negative going pulse.

Regulated voltage of approximately 4.5 volts d.c. is provided from a 6 volt radiosonde battery by resistor 60, rectifier 62 and transistor 64. Rectifier 62 is a 5.1 volt zener diode which is biased through resistor 60 from the battery and provides a stable positive bias voltage to transistor 64. Transistor 64 is connected as an emitter follower and provides the current required by the oscillator and pulse shaper.

Typical valves for the various circuit elements are as follows:

| Element No | Value |
| --- | --- |
| 10 | 2N3415 |
| 12 | 2N3906 |
| 18 | 3.0K |
| 20 | 4.7K |
| 22 | 100K |
| 26 | 470K |
| 28 | 1 Meg |
| 30 | 7.5K |
| 32 | 2.2K |
| 34 | 1.25K |
| 36 | 56K |

-continued

| Element No | Value |
|---|---|
| 37 | 6.8μf |
| 40 | .47 f |
| 42 | 200K |
| 44 | .015μ |
| 46 | 470K |
| 50 | SN 74121 N |
| 52 | 2N3415 |
| 56 | .047μf |
| 58 | .047μf |
| 60 | 100Ω |
| 62 | 1N5231 B |
| 64 | 2N3415 |
| 66 | 3K |

Thus, a circuit has been described which permits use of an $Al_2O_3$ sensor for atmospheric water vapor measurements on conventional radiosondes. Components, construction and power requirements have been selected for compatibility and to permit low cost manufacture. Semi-synoptic measurements of atmospheric water vapor profiles are therefore possible at moderate cost.

Obviously, many modifications and variations of the present invention are possible in light of the above teachings. It is therefore to be understood that, within the scope of the appended claims, the invention may be practiced otherwise than as specifically described.

What is claimed is:

1. A circuit for measuring the impedance of an $Al_2O_3$ water vapor sensor used in a radiosonde telemetry system, which system has a transmitter, said circuit comprising:

oscillator means for producing a temperature stabilized cyclical output, said oscillator means having an $Al_2O_3$ water vapor sensor as a feedback frequency-control element, the frequency of said oscillator being independent of temperature effects, said oscillator means includes first and second transistors, the collector of said second transistor being connected through said sensor to the base of said first transistor, the collector of said first transistor being connected to the base of said second transistor;

pulse shaping means for receiving the output from said oscillator means and converting it to a pulse suitable for modulating the transmitter of said radiosonde, said pulse shaping means includes a buffering transistor, the base of said buffering transistor being connected to the collector of said second transistor, said pulse shaping means further includes a one-shot multivibrator integrated circuit connected to the collector output of said buffering transistor, said one-shot multivibrator providing an output pulse for each cycle of said oscillator means; and voltage regulator means for providing a relatively constant dc voltage input to said oscillator means and said pulse shaping means.

* * * * *